United States Patent
Okada et al.

(10) Patent No.: US 7,696,106 B2
(45) Date of Patent: Apr. 13, 2010

(54) FILM FORMATION METHOD AND APPARATUS FOR SEMICONDUCTOR PROCESS

(75) Inventors: Mitsuhiro Okada, Nirasaki (JP); Kazumi Kubo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/216,703

(22) Filed: Jul. 9, 2008

(65) Prior Publication Data
US 2009/0029562 A1    Jan. 29, 2009

(30) Foreign Application Priority Data
Jul. 25, 2007   (JP)   .............. 2007-192914

(51) Int. Cl.
*H01L 21/314*   (2006.01)
(52) U.S. Cl. ............................. 438/763; 257/E21.27
(58) Field of Classification Search ............. 438/763; 257/E21.27
See application file for complete search history.

(56) References Cited

U.S. PATENT DOCUMENTS

| | | | |
|---|---|---|---|
| 5,246,884 A | * | 9/1993 | Jaso et al. .............. 438/693 |
| 5,947,718 A | * | 9/1999 | Weaver .................. 432/77 |
| 6,933,225 B2 | * | 8/2005 | Werkhoven et al. ...... 438/627 |
| 7,064,078 B2 | | 6/2006 | Liu et al. |
| 7,183,197 B2 | * | 2/2007 | Won et al. ............... 438/622 |

* cited by examiner

*Primary Examiner*—W. David Coleman
*Assistant Examiner*—Daniel Shook
(74) *Attorney, Agent, or Firm*—Smith, Gambrell & Russell, LLP

(57) ABSTRACT

A film formation method for a semiconductor process includes placing a plurality of target objects at intervals in a vertical direction inside a process container of a film formation apparatus. Then, the method includes setting the process container to have a first vacuum state therein, and supplying a first film formation gas containing a hydrocarbon gas into the process container, thereby forming a carbon film by CVD on the target objects. Then, the method includes setting the process container to have a second vacuum state therein, while maintaining the process container to have a vacuum state therein from the first vacuum state, and supplying a second film formation gas containing an organic silicon source gas into the process container, thereby forming an Si-containing inorganic film by CVD on the carbon film.

6 Claims, 5 Drawing Sheets

FILM FORMATION METHOD AND APPARATUS FOR SEMICONDUCTOR PROCESS

BACKGROUND OF THE INVENTION

1. Field of the Invention

The present invention relates to a film formation method and apparatus for a semiconductor process for forming a multi-layered film containing a carbon film, which is incorporated in, e.g., a multi-layered resist structure used as a mask for manufacturing semiconductor devices. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In the process of manufacturing semiconductor devices, a plasma etching process is performed by use a resist mask to form a circuit pattern. A photolithography technique is used to perform patterning of such a resist mask. For semiconductor devices in the generation with a CD of 45 nm, ArF resist is used to address miniaturization, but it is low in plasma resistance. In order to solve this problem, there is proposed a method in which a mask (having a multi-layered resist structure) is prepared by laminating an $SiO_2$ film and a plasma resistant resist below ArF resist. However, for semiconductor devices in the generation with a CD of smaller than 45 nm, the film thickness of ArF resist needs to be as small as 200 nm. Where this ArF resist film thickness is used for plasma etching, an $SiO_2$ film to be etched through the ArF resist and a resist film therebelow to be etched through the $SiO_2$ film need to have a total thickness of smaller than 300 nm. In this case, however, such a mask cannot have a sufficient plasma resistance in light of the thickness of an etching target film, thereby deteriorating accuracy of etching. In light of this problem, an alternative film having a higher etching resistance is required in place of the resist film on the lower side. There is proposed a technique in which an amorphous carbon film is used as such an alternative film (U.S. Pat. No. 7,064,078 etc). Conventionally, studies are made to form an amorphous carbon film of this kind by single substrate CVD.

However, the single substrate CVD is high in initial cost and low in productivity. Further, since amorphous carbon can be easily oxidized and degraded, it is necessary to maintain the film quality of the amorphous carbon film when a subsequent film is formed on the amorphous carbon film.

BRIEF SUMMARY OF THE INVENTION

An object of the present invention is to provide a film formation method and apparatus for a semiconductor process, which can form a carbon film, such as an amorphous carbon film, and an Si-containing inorganic film, with high efficiency, high productivity, and low cost, while preventing the carbon film from being deteriorated in film quality. Another object of the present invention is to provide a storage medium that stores a control program for executing the film formation method.

According to a first aspect of the present invention, there is provided a film formation method for a semiconductor process, the method comprising: placing a plurality of target objects at intervals in a vertical direction inside a process container of a film formation apparatus; then, setting the process container to have a first vacuum state therein, and supplying a first film formation gas containing a hydrocarbon gas into the process container, thereby forming a carbon film by CVD on the target objects; and then, setting the process container to have a second vacuum state therein, while maintaining the process container to have a vacuum state therein from the first vacuum state, and supplying a second film formation gas containing an organic silicon source gas into the process container, thereby forming an Si-containing inorganic film by CVD on the carbon film.

According to a second aspect of the present invention, there is provided a film formation apparatus for a semiconductor process, the apparatus comprising: a process container configured to maintain a vacuum state therein; a holder configured to hold a plurality of target objects at intervals in a vertical direction inside the process container; a heating device disposed around the process container to heat an interior of the process container; an exhaust system configured to exhaust gas from inside the process container to set a vacuum state therein; a first gas supply system configured to supply a first film formation gas containing a hydrocarbon gas into the process container to form a carbon film; a second gas supply system configured to supply a second film formation gas containing an organic silicon source gas into the process container to form an Si-containing inorganic film; and a controller configured to control an operation of the apparatus, wherein the controller is preset: to set the process container accommodating the target objects to have a first vacuum state therein, and to supply the first film formation gas into the process container, thereby forming a carbon film by CVD on the target objects; and then, to set the process container to have a second vacuum state therein, while maintaining the process container to have a vacuum state therein from the first vacuum state, and to supply the second film formation gas into the process container, thereby forming an Si-containing inorganic film by CVD on the carbon film.

According to a third aspect of the present invention, there is provided a computer readable medium containing program instructions for execution on a processor, wherein the program instructions, when executed by the processor, cause a film formation apparatus for a semiconductor process to conduct a film formation method comprising: setting a process container, which accommodates a plurality of target objects at intervals in a vertical direction, to have a first vacuum state therein, and supplying a first film formation gas containing a hydrocarbon gas into the process container, thereby forming a carbon film by CVD on the target objects; and then, setting the process container to have a second vacuum state therein, while maintaining the process container to have a vacuum state therein from the first vacuum state, and supplying a second film formation gas containing an organic silicon source gas into the process container, thereby forming an Si-containing inorganic film by CVD on the carbon film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodi

DETAILED DESCRIPTION OF THE INVENTION

Figure 1:
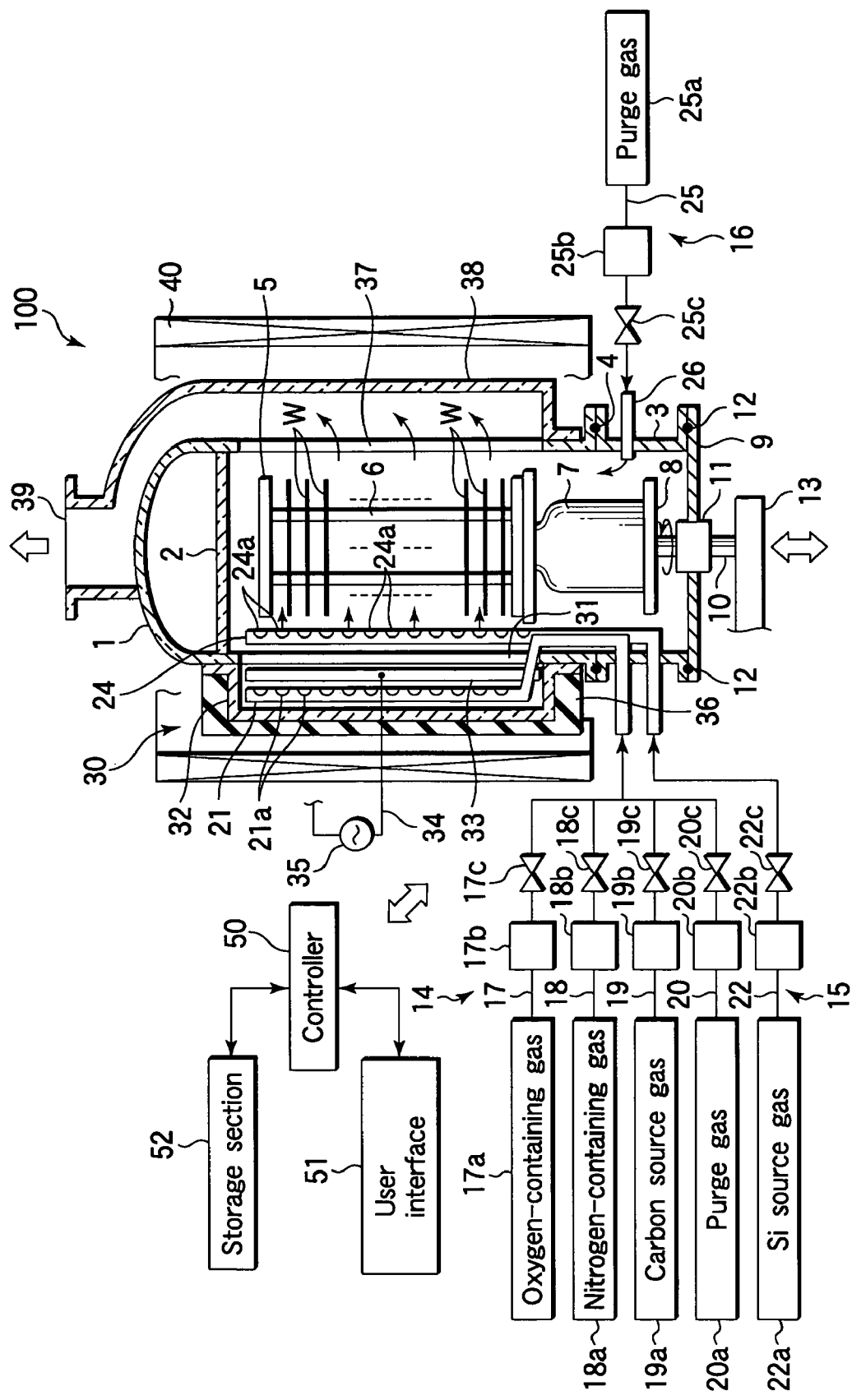
- FIG. 1 is a sectional front view showing a film formation apparatus for performing a film formation method according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary. In this embodiment, an explanation will be given of a case where a carbon film at the bottom of a multi-layered resist structure and an Si-containing film laminated thereon are formed in-situ in a batch type vertical furnace.

Figure 2:
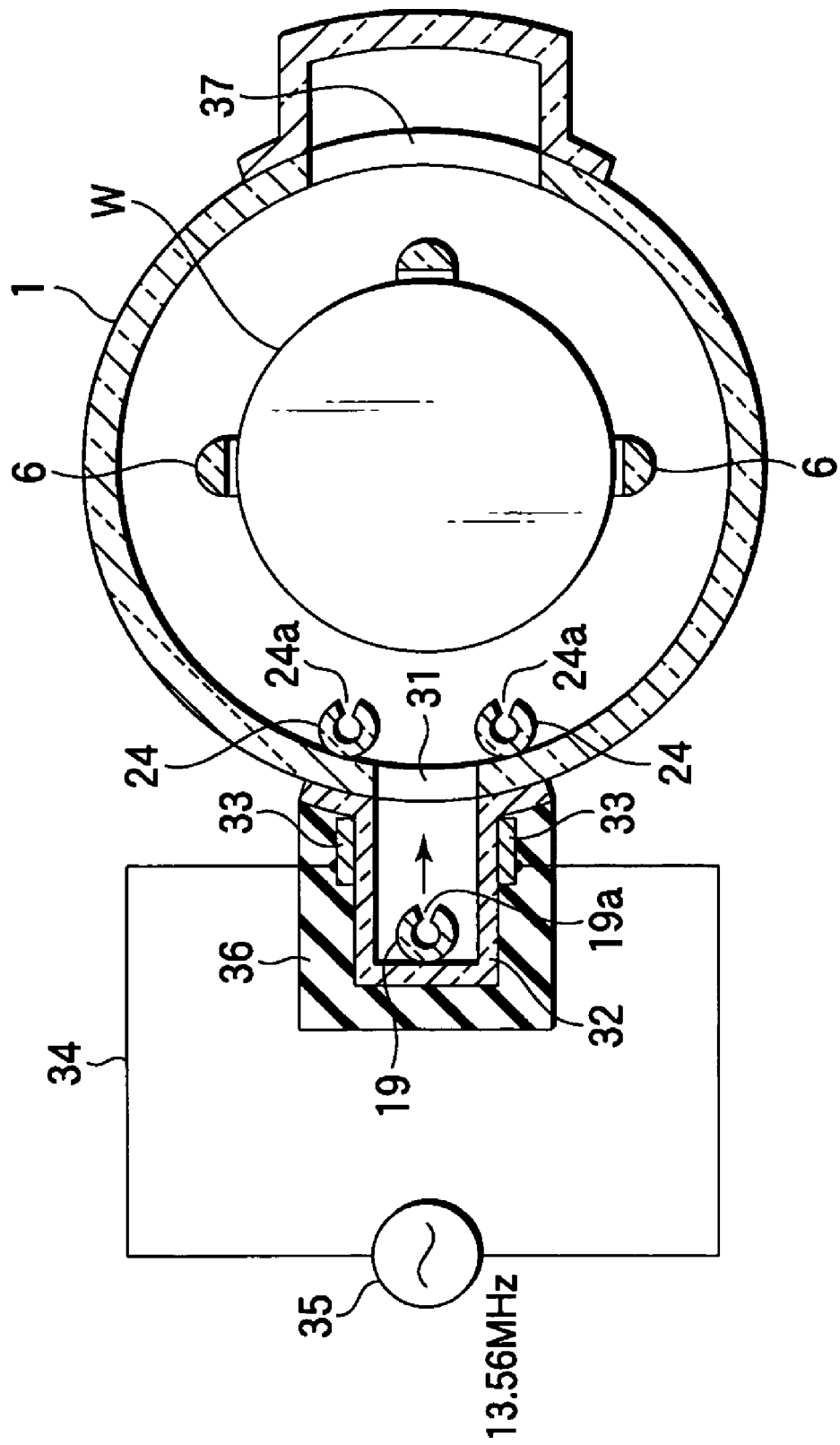
FIG. 2 is a sectional plan view showing part of the film formation apparatus shown in FIG. 1.

FIG. 1 is a sectional front view showing a film formation apparatus for performing a film formation method according to an embodiment of the present invention. FIG. 2 is a sectional plan view showing part of the film formation apparatus shown in FIG. 1. In FIG. 2, a heating device is not shown.

The film formation apparatus 100 is formed of a batch type vertical furnace and includes a process container 1 shaped as a cylindrical column with a ceiling and an opened bottom. The entirety of the process container 1 is made of, e.g., quartz. The top of the process container 1 is provided with a quartz ceiling plate 2 to airtightly seal the top. The opened bottom of the process container 1 is connected through a seal member 4, such as an O-ring, to a cylindrical manifold 3 made of, e.g., stainless steel.

The manifold 3 supports the bottom of the process container 1. A wafer boat 5 made of quartz is moved up and down through the bottom port of the manifold 3, so that the wafer boat 5 is loaded/unloaded into and from the process container 1. A number of, such as about 50 to 100, target objects or semiconductor wafers W are stacked on a wafer boat 5. The wafer boat 5 has three struts 6 (see FIG. 2) with grooves on which a number of wafers W are respectively supported.

The wafer boat 5 is placed on a table 8 through a heat-insulating cylinder 7 made of quartz. The table 8 is supported by a rotary shaft 10, which penetrates a lid 9 made of, e.g., stainless steel, and used for opening/closing the bottom port of the manifold 3.

The portion of the lid 9 where the rotary shaft 10 penetrates is provided with, e.g., a magnetic-fluid seal 11, so that the rotary shaft 10 is rotatably supported in an airtightly sealed state. A seal member 12, such as an O-ring, is interposed between the periphery of the lid 9 and the bottom of the manifold 3, so that the interior of the process container 1 can be kept sealed.

For example, the rotary shaft 10 is attached at the distal end of an arm 13 supported by an elevating mechanism (not shown), such as a boat elevator. The elevating mechanism moves the wafer boat 5 and lid 9 up and down in unison into and from the process container 1. The table 8 may be fixed to the lid 9, so that wafers W are processed without rotation of the wafer boat 5.

The film formation apparatus 100 includes a first gas supply mechanism 14, a second gas supply mechanism 15, and a third gas supply mechanism 16.

The first gas supply mechanism 14 includes an oxygen-containing gas supply line 17 for supplying an oxygen-containing gas, such as O$_2$ gas, into the process container 1, a nitrogen-containing gas supply line 18 for supplying a nitrogen-containing gas, such as NH$_3$ gas, into the process container 1, a carbon source gas supply line 19 for supplying a carbon source gas, and a purge gas supply line 20 for supplying an inactive gas, such as N$_2$ gas, for line purge. The oxygen-containing gas supply line 17 is connected to an oxygen-containing gas supply source 17a through a flow rate controller 17b, such as a mass flow controller, and a switching valve 17c. The nitrogen-containing gas supply line 18 is connected to a nitrogen-containing gas supply source 18a through a flow rate controller 18b and a switching valve 18c. The carbon source gas supply line 19 is connected to a carbon source gas supply source 19a through a flow rate controller 19b and a switching valve 19c. The purge gas supply line 20 is connected to a purge gas supply source 20a through a flow rate controller 20b and a switching valve 20c.

The oxygen-containing gas supply line 17, nitrogen-containing gas supply line 18, purge gas supply line 19, and purge gas supply line 20 are connected to a gas distribution nozzle 21 formed of a quartz pipe which penetrates the sidewall of the manifold 3 from the outside and then turns and extends vertically upward. The vertical portion of the gas distribution nozzle 21 has a plurality of gas spouting holes 21a formed thereon at predetermined intervals, so that gas is almost uniformly delivered in the horizontal direction from the gas spouting holes 21a toward the process container 1.

The second gas supply mechanism 15 includes an Si source gas supply line 22 for supplying an Si source gas into the process container 1. The Si source gas supply line 22 is connected to an Si source gas supply source 22a through a flow rate controller 22b and a switching valve 22c. The Si source gas supply line 22 is connected to two gas distribution nozzles 24 each formed of a quartz pipe which penetrates the sidewall of the manifold 3 from the outside and then turns and extends vertically upward. Each of the two gas distribution nozzles 24 (see FIG. 2) has a plurality of gas spouting holes 24a formed thereon at predetermined intervals in the longitudinal direction, so that gas is almost uniformly delivered in the horizontal direction from the gas spouting holes 24a toward the process container 1. Only one gas distribution nozzle 24 may be used.

The third gas supply mechanism 16 includes a purge gas supply line 25 for supplying a purge gas into the process container 1. The purge gas line 25 is connected to a purge gas supply source 25a through a flow rate controller 25b and a switching valve 25c. The purge gas supply line 25 is connected to a purge gas nozzle 26 which penetrates the sidewall of the manifold 3.

A plasma generating mechanism 30 is formed at a part of the sidewall of the process container 1 for generating plasma of a supplied gas. The plasma generating mechanism 30 has a vertically long and thin opening 31 formed by cutting a predetermined width of the sidewall of the process container 1, in the vertical direction. The opening 31 is covered with a plasma cover wall 32 airtightly connected to the outer surface of the process container 1 by welding. The plasma cover wall 32 is formed of, e.g., quartz and has a vertical long and thin shape with a concave cross-section, so that it projects outward from the process container 1.

A pair of long and thin plasma electrodes 33 are disposed on the opposite outer surfaces of the plasma cover wall 32, and face each other while extending in the vertical direction. The plasma electrodes 33 are connected to an RF (Radio Frequency) power supply 35 for supplying an RF power through feed lines 34. An RF voltage of, e.g., 13.56 MHz is applied from the power supply 35 to the plasma electrodes 33 to generate plasma of the oxygen-containing gas, for example. The frequency of the RF voltage is not limited to 13.56 MHz, and it may be set at another frequency, e.g., 400 kHz.

The plasma cover wall 32 described above is formed such that the sidewall of the process container 1 projects outward to define an inner concave, while the inner space of the plasma cover wall 32 communicates with the inner space of the process container 1. The opening 31 has a vertical length sufficient to cover all the wafers W on the wafer boat 5 in the vertical direction.

The gas distribution nozzle 21 is bent outward in the radial direction of the process container 1 while it extends upward inside the process container 1. Then, the gas distribution nozzle 21 vertically extends at the deepest position (the farthest position from the center of the process container 1) inside the plasma cover wall 32. For example, when the RF power supply 35 is turned on and an RF electric field is thereby generated between the two electrodes 33, oxygen gas spouted from the gas spouting holes 21a of the gas distribution nozzle 21 is turned into plasma and is supplied and diffused toward the center of the process container 1.

An insulating protection cover 36 made of, e.g., quartz is attached on and covers the outer surface of the plasma cover wall 32. A coolant passages (not shown) are formed inside the insulating protection cover 36 and can be supplied with a coolant, such as cooled nitrogen gas, to cool the plasma electrodes 33.

The two gas distribution nozzles 24 extend upward at the opposite positions sandwiching the opening 31 inside the sidewall of the process container 1. The Si source gas is spouted from the gas spouting holes 24A of the gas distribution nozzle 24 toward the center of the process container 1.

On the other hand, on the side of the process container 1 opposite to the opening 31, the process container 1 has an exhaust port 37 formed thereon for vacuum-exhausting the interior of the process container 1. The exhaust port 37 has a long and thin shape formed by cutting the sidewall of the process container 1 in the vertical direction. The exhaust port 37 is covered with an exhaust port cover member 38 having a U-shape cross-section, and attached to the process container 1 by welding. The exhaust port cover member 38 extends upward along the sidewall of the process container 1, and has a gas outlet 39 at the top of the process container 1. The gas outlet 39 is connected to a vacuum-exhaust mechanism (not shown) including a vacuum pump and so forth. The process container 1 is surrounded by a cylindrical heating device 40 for heating the atmosphere and wafers W inside the process container 1.

The film formation apparatus 100 includes a controller 50 comprising a microprocessor (computer), which controls the respective components in the film formation apparatus 100. For example, the controller 50 controls the switching valves to supply/stop the gases by opening/closing them, the flow rate controllers to adjust the flow rates of the gases, the RF power supply 35 to turn on/off an RF power, and the heating device 40. The controller 50 is connected to the user interface 51, which includes, e.g., a keyboard and a display, wherein the keyboard is used for an operator to input commands for operating the film formation apparatus 100, and the display is used for showing visualized images of the operational status of the film formation apparatus 100.

Further, the controller 50 is connected to a storage section 52 that stores recipes, i.e., control programs for the controller 50 to control the film formation apparatus 100 so as to perform various processes, and control programs for the respective components of the film formation apparatus 100 to perform processes in accordance with process conditions. The recipes are stored in a storage medium included in the storage section 52. The storage medium may be formed of a medium of the stationary type, such as a hard disk or semiconductor memory, or a medium of the portable type, such as a CDROM, DVD, or flash memory. Alternatively, the recipes may be used online while they are transmitted from another apparatus through, e.g., a dedicated line, as needed.

A required recipe is retrieved from the storage section 52 and executed by the controller 50 in accordance with an instruction or the like input through the user interface 51. Consequently, the film formation apparatus 100 can perform a predetermined process under the control of the controller 50.

Next, an explanation will be given of a film forming method according to an embodiment performed in the film formation apparatus having the structure described above.

Figure 3:
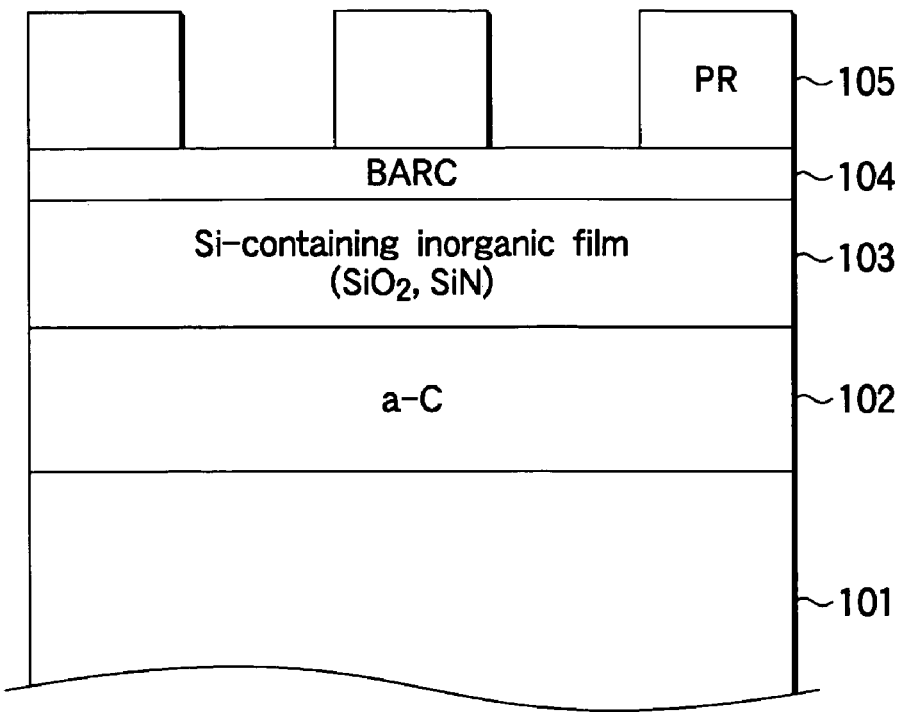
FIG. 3 is a sectional plan view showing a multi-layered resist structure, to which a film formation method according to an embodiment is applied.

A film formation method according to this embodiment may be applied to a multi-layered resist structure disposed on an etching target film. Specifically, as shown in FIG. 3, the multi-layered resist structure disposed on an etching target film 101 includes an amorphous carbon film (a-C) 102, an Si-containing inorganic film 103 used as a hard mask layer, an anti-reflection coating film (BARC) 104, and a resist film (PR) 105 formed in this order from below. The resist film 105 is patterned by photolithography and then this pattern is copied on the Si-containing inorganic film 103 and amorphous carbon film 102. Then, these layers are used as a mask to etch the etching target film 101. This embodiment is applied to formation of the amorphous carbon film 102 and Si-containing inorganic film 103.

The Si-containing inorganic film 103 is preferably formed of an $SiO_2$ film, SiN film, or a multi-layered film of them.

Figure 4:
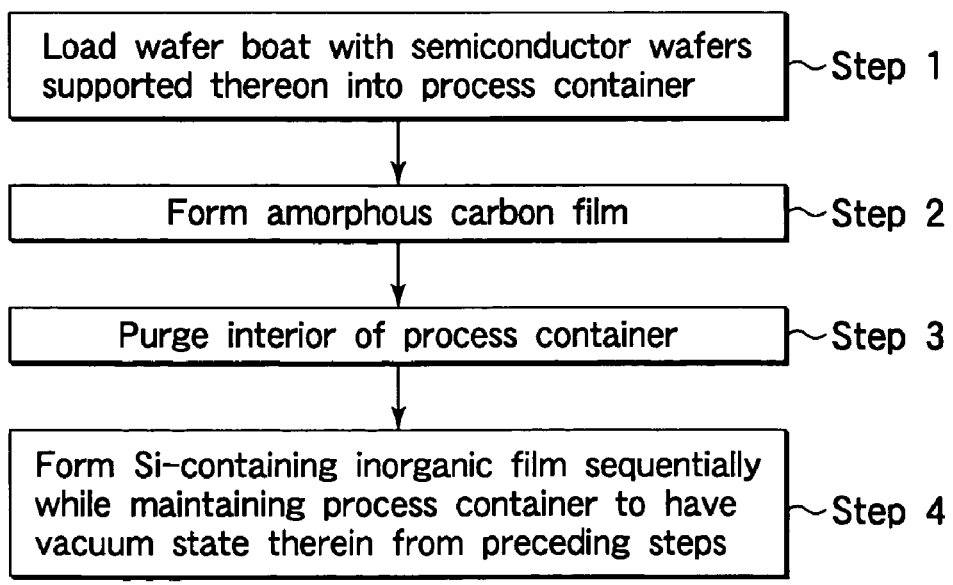
FIG. 4 is a flow chart showing steps of the film formation method according to an embodiment.

As shown in the flow chart of FIG. 4, where the film formation method according to the embodiment is performed, at first, the wafer boat 5 at room temperature, which supports a number of, such as 50 to 100, wafers, is loaded from below into the process container 1 heated at a predetermined temperature (Step 1). Then, the bottom port of the manifold 3 is closed by the lid 9 to set an airtight space inside the process container 1. For example, the semiconductor wafers W have a diameter of 300 mm.

Then, the interior of the process container 1 is vacuum-exhausted and kept at a predetermined process pressure. Further, the electric power applied to the heating device 40 is controlled to increase and set the wafer temperature to a process temperature. Then, while the wafer boat 5 is rotated, a film formation process of the amorphous carbon film is first started (Step 2).

In the film formation process of the amorphous carbon film, a predetermined carbon source gas is supplied from the carbon source gas supply source 19a through the carbon source gas line 19 into the process container 1. At this time, if required, the carbon source gas is plasma-excited by the plasma generating mechanism 30 to form the amorphous carbon film on the etching target film on each semiconductor wafer W by plasma CVD. At this time, $N_2$ gas used as a dilution gas may be supplied through the purge gas supply line 25 into the process container 1. The frequency and power of the RF power used for the plasma generating mechanism 30 are suitably set in accordance with the required reactivity. Since a plasma-excited gas has high reactivity, the film formation temperature can be lowered.

However, this plasma generation is not indispensable, and thermal CVD film formation may be alternatively used where the reactivity of a gas is sufficient. For example, in the film formation process of the amorphous carbon film according to this embodiment, ethylene ($C_2H_4$) is preferably used as a carbon source gas. In this case, the film formation process is preferable performed while supplying ethylene into the process container 1 without plasma-exciting it by the plasma generating mechanism 30, but activating it by use of a process temperature described below.

The carbon source gas can be any gas as long as it provides carbon by a reaction in film formation, and is typically formed of a process gas containing a hydrocarbon gas. This hydrocarbon gas is exemplified by ethylene ($C_2H_4$), methane ($CH_4$), ethane ($C_2H_6$), acetylene ($C_2H_2$), and butyne ($C_4H_6$). In addition to a hydrocarbon gas, an inactive gas, such as Ar gas, and hydrogen gas may be used.

In the amorphous carbon film formation, the pressure inside the process container 1 is preferably set to be 6,667 to 66,665 Pa. At this time, the wafer temperature (film formation temperature) is preferably set to be 800° C. or less, and more preferably to be 600 to 700° C.

After the amorphous carbon film is thus formed, a purge gas is supplied from the purge gas supply source 25a of the third gas supply mechanism 16 through the purge gas line 25 into the process container 1 to purge the interior of the process container 1 (Step 3).

Then, while a vacuum state is maintained from the preceding steps, a film formation process of the Si-containing inorganic film is sequentially performed in-situ, only by switching gases (Step 4).

In the film formation process of the Si-containing inorganic film, the silicon source gas is supplied from the second gas supply mechanism 15 into the process container 1. Further, the oxygen-containing gas and/or nitrogen-containing gas are supplied from the first gas supply mechanism 14 into the process container 1. Consequently, an $SiO_2$ film and/or an SiN film are formed.

The silicon source may be an organic silicon, such as, an ethoxysilane gas or aminosilane gas. The ethoxysilane is exemplified by TEOS (tetraethoxysilane) The aminosilane is exemplified by TDMAS (tridimethyl-aminosilane), BTBAS (bistertialbutylaminosilane), BDMAS (bisdimethylaminosilane), BDEAS (bisdiethylaminosilane), DMAS (dimethylaminosilane), DEAS (diethylaminosilane), DPAS (dipropylaminosilane), and BAS (butylaminosilane).

Where the Si-containing inorganic film is an $SiO_2$ film, an oxygen-containing gas is used as an oxidizing agent, as described above. For example, the oxygen-containing gas is supplied from the first gas supply mechanism 14 into the inner space of the plasma generating mechanism 30 and is excited into plasma in this space. This excited oxygen-containing plasma is used to oxidize the silicon source gas, thereby forming an $SiO_2$ film.

The oxygen-containing gas is exemplified by $O_2$ gas, NO gas, $N_2O$ gas, $H_2O$ gas, and $O_3$ gas. As described above, the gas is used as an oxidizing agent while being plasma-excited by an RF electric field to provide high reactivity. Of them, $O_2$ plasma is preferably used. Where $O_3$ gas is used, the plasma excitation is unnecessary to provide high reactivity, because its own reactivity is high. For the other oxygen-containing gases, the plasma excitation is not indispensable, but is preferably used to provide high reactivity.

Figure 5:
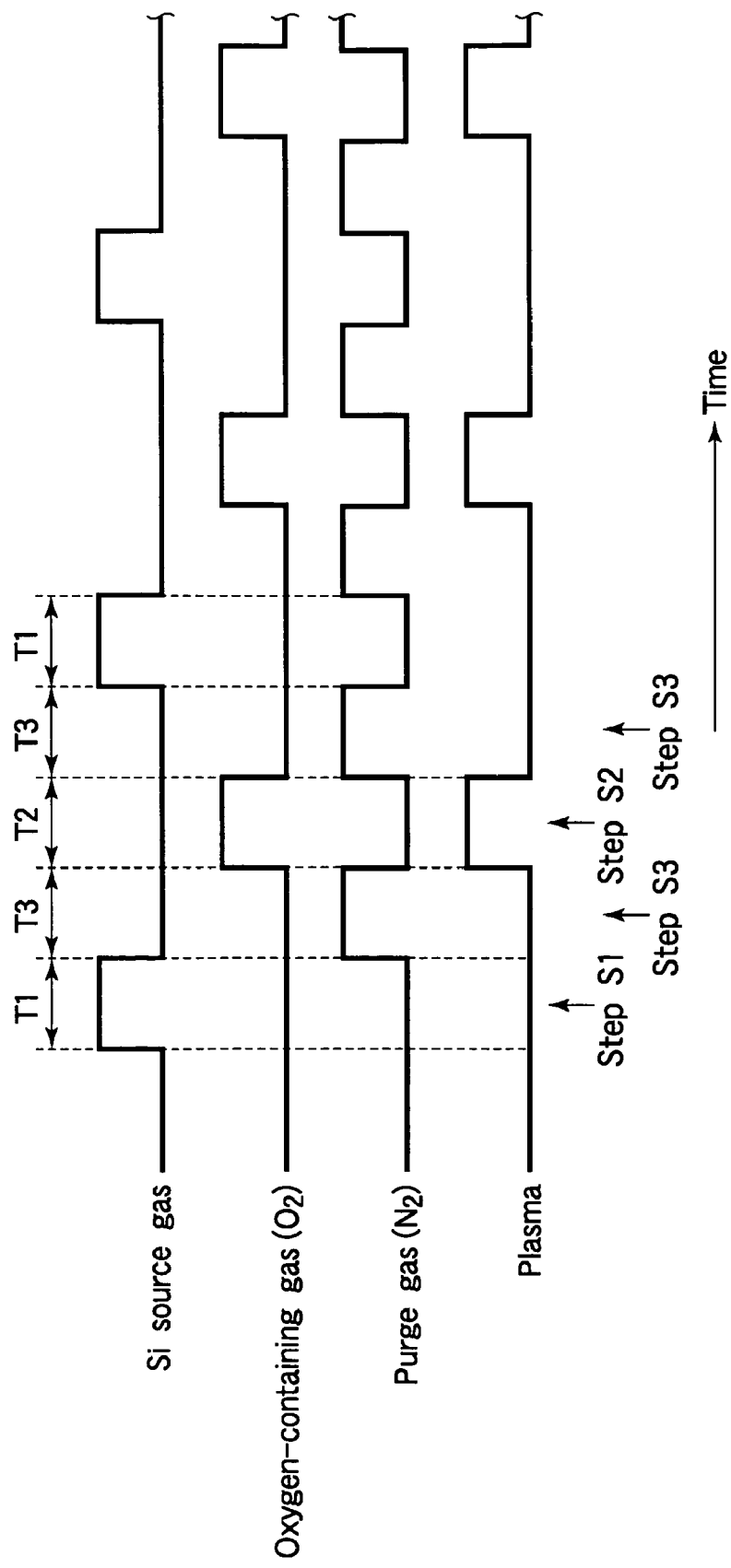
FIG. 5 is a timing chart showing gas supply used for forming an SiO$_2$ film in the film formation method according to an embodiment.

The $SiO_2$ film may be formed by supplying the Si source gas and oxygen-containing gas at the same time. However, in order to lower the film formation temperature, an MLD (Molecule Layered Deposition) method is preferably used, as shown in FIG. 5. The MLD method is arranged to alternately repeat a Step S1 of supplying the Si source gas into the process container 1 to adsorb the Si source and a Step S2 of supplying the oxygen-containing gas into the process container 1 to oxidize the Si source, with a Step S3 interposed therebetween of purging the interior of the process container 1 to remove the residual gas therefrom.

Specifically, in the Step S1, the Si source gas described above is supplied through the Si source gas line 22 of the second gas supply mechanism 15 and is spouted from the gas spouting holes 24a of the gas distribution nozzle 24 into the process container 1 for a time period T1. Consequently, the Si source is adsorbed on the amorphous carbon film on each semiconductor wafer. The time period T1 is set to be, e.g., 1 to 300 sec. At this time, the pressure inside the process container 1 is set to be, e.g., 1.33 to 3,990 Pa. The flow rate of the Si source gas is set to be, e.g., 1 to 5,000 mL/min (sccm).

In the Step S2 of supplying the oxygen-containing gas, the oxygen-containing gas, such as $O_2$ gas, is supplied through the oxygen-containing gas supply line 17 of the first gas supply mechanism 14 and is spouted from the gas spouting holes 21a of the gas distribution nozzle 21 into the process container 1. At this time, the RF power supply 35 of the plasma generating mechanism 30 is set in the ON-state to generate an RF electric field, by which the oxygen-containing gas, such as $O_2$ gas, is turned into plasma. The oxygen-containing gas thus plasma-excited is then supplied into the process container 1. Consequently, the Si source adsorbed on each semiconductor wafer W is oxidized and turned into $SiO_2$. The process time period T2 is set to be, e.g., 1 to 300 sec. At this time, the pressure inside the process container 1 is set to be, e.g., 1.33 to 3,990 Pa. The flow rate of the oxygen-containing gas is set to be, e.g., 0.1 to 30 mL/min (sccm), although it depends on the number of semiconductor wafers W supported on the wafer boat 5. The RF power supply 35 is set to apply an RF power with, e.g., a frequency of 13.56 MHz and a power of 10 to 1,000 W.

A Step S3 performed between the Steps S1 and S2 or between the Steps S2 and S1 is a step of removing the residual gas from inside the process container 1 after the Step S1 or Step S2, so as to allow a predetermined reaction to be caused in the next step. Specifically, the interior of the process container 1 is vacuum-exhausted, while an inactive gas, such as $N_2$ gas, used as a purge gas, is supplied through the purge gas supply line 25 of the third gas supply mechanism 16 and is spouted from the purge gas nozzle 26 into the process container 1. The time period T3 of the Step S3 is set to be, e.g., 1 to 300 sec. At this time, the pressure inside the process container 1 is set to be, e.g., 1.33 to 3,990 Pa. The flow rate of the purge gas is set to be, e.g., 0.1 to 30 L/min (slm). A Step S3 may be arranged to continuously perform only vacuum-exhaust while shutting off all the gases including the purge gas, if this operation can sufficiently remove the residual gas from inside the process container 1. However, where the purge gas is supplied, it is possible to remove the residual gas from inside the process container in a shorter time.

As described above, since the MLD method is used, an $SiO_2$ film can be formed at a low temperature of 300° C. or less, and further at a very low temperature of 100° C. or less by optimizing the conditions. Further, since the MLD method is used for the SiO$_2$ film formation after the amorphous carbon film formation while a vacuum state is maintained between them, the amorphous carbon film can be hardly oxidized even if the SiO$_2$ film is formed directly on the amorphous carbon film.

The Si source gas and oxygen-containing gas may be supplied at the same time to form the SiO$_2$ film. In this case, the pressure inside the process container 1 is set to be, e.g., 7 to 1,343 Pa. The flow rate of the Si source gas is set to be, e.g., 1 to 2,000 mL/min (sccm). The flow rate of the oxygen-containing gas is set to be, e.g., 5 to 5,000 (sccm). However, at this time, the film formation temperature needs to be set at a relatively high temperature of 400 to 750° C. In this case, even if the SiO$_2$ film formation is performed after the amorphous carbon film formation while a vacuum state is maintained between them, the amorphous carbon film may be oxidized by the oxygen-containing gas. In consideration of this problem, an SiN film is preferably formed as a cap layer on the amorphous carbon film.

Where the Si-containing inorganic film comprises an SiN film, a nitrogen-containing gas is used for nitridation, as described above. For example, the nitrogen-containing gas is supplied from the first gas supply mechanism 14 into the inner space of the plasma generating mechanism 30 and is excited into plasma in this space. This excited nitrogen-containing plasma is used to nitride the silicon source gas, thereby forming an SiN film.

The nitrogen-containing gas is exemplified by NH$_3$, N$_2$, NO, N$_2$O, and N$_2$H$_4$ gas. As described above, the gas is plasma-excited by an RF electric field to provide high reactivity. Of them, NH$_3$ gas is preferably used. For the nitrogen-containing gas, the plasma excitation is not indispensable, but is preferably used to provide high reactivity.

Figure 6:
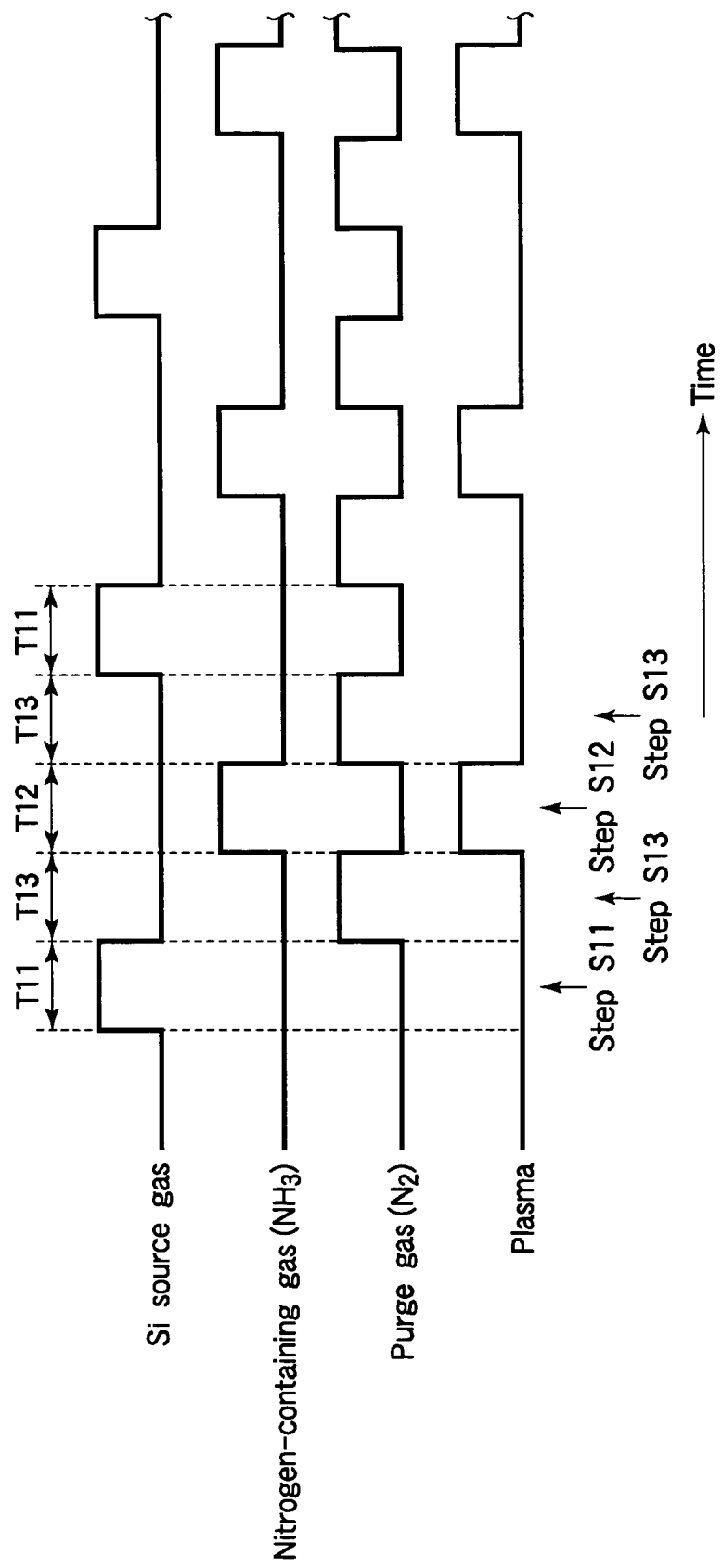
FIG. 6 is a timing chart showing gas supply used for forming an SiN film in the film formation method according to an embodiment.

The SiN film may be formed by supplying the Si source gas and nitrogen-containing gas at the same time. However, in order to lower the film formation temperature, an MLD (Molecule Layered Deposition) method is preferably used, as shown in FIG. 6. The MLD method is arranged to alternately repeat a Step S11 of supplying the Si source gas into the process container 1 to adsorb the Si source and a Step S12 of supplying the nitrogen-containing gas into the process container 1 to nitride the Si source, with a Step S13 interposed therebetween of purging the interior of the process container 1 to remove the residual gas therefrom.

Specifically, in the Step S11, the Si source gas described above is supplied through the Si source gas line 22 of the second gas supply mechanism 15 and is spouted from the gas spouting holes 24a of the gas distribution nozzle 24 into the process container 1 for a time period T11. Consequently, the Si source is adsorbed on the amorphous carbon film on each semiconductor wafer. The conditions used at this time are set as in the conditions of the Step S1 used for forming the SiO$_2$ film described above. Specifically, the time period T11 is set to be, e.g., 1 to 300 sec. The pressure inside the process container 1 is set to be, e.g., 1.33 to 3,990 Pa. The flow rate of the Si source gas is set to be, e.g., 1 to 5,000 mL/min (sccm).

In the Step S12 of supplying the nitrogen-containing gas, the nitrogen-containing gas, such as NH$_3$ gas, is supplied through the nitrogen-containing gas supply line 18 of the first gas supply mechanism 14 and is spouted from the gas spouting holes 21a of the gas distribution nozzle 21 into the process container 1. At this time, the RF power supply 35 of the plasma generating mechanism 30 is set in the ON-state to generate an RF electric field, by which the nitrogen-containing gas, such as NH$_3$ gas, is turned into plasma. The nitrogen-containing gas thus plasma-excited is then supplied into the process container 1. Consequently, the Si source adsorbed on each semiconductor wafer W is nitrided and turned into SiN. The process time period T12 is set to be, e.g., 1 to 300 sec. At this time, the pressure inside the process container 1 is set to be, e.g., 1.33 to 3,990 Pa. The flow rate of the nitrogen-containing gas is set to be, e.g., 100 to 10,000 mL/min (sccm), although it depends on the number of semiconductor wafers W supported on the wafer boat 5. The RF power supply 35 is set to apply an RF power with, e.g., a frequency of 13.56 MHz and a power of 10 to 1,000 W.

A Step S13 between the Steps S11 and S12 or between the Steps S12 and S11 is performed under almost the same conditions as the step 3.

As described above, since the MLD method is used, an SiN film can be formed at a low temperature of 300° C. or less, and further at a very low temperature of 100° C. or less by optimizing the conditions.

The Si source gas and nitrogen-containing gas may be supplied at the same time to form the SiN film. In this case, the pressure inside the process container 1 is set to be, e.g., 7 to 1,343 Pa. The flow rate of the Si source gas is set to be, e.g., 1 to 2,000 mL/min (sccm). The flow rate of the nitrogen-containing gas is set to be, e.g., 5 to 5,000 (sccm). However, at this time, the film formation temperature needs to be set at a relatively high temperature of 400 to 800° C.

As described above, by use of a batch type apparatus for processing a plurality of semiconductor wafers together at a time, an amorphous carbon film and an Si-containing inorganic film used as a hard mask layer are sequentially formed in-situ while a vacuum state is maintained between them. Consequently, these films can be formed with high efficiency, high productivity, and low cost, while preventing the amorphous carbon film from being deteriorated in film quality due to oxidation.

Next, an explanation will be given of results obtained by the method according to the embodiment of the present invention, in which an amorphous carbon film and an SiO$_2$ film were sequentially formed.

At first, 50 semiconductor wafers were loaded in the apparatus shown in FIG. 1. Then, ethylene gas set at a flow rate of 2,000 mL/min (sccm) and N$_2$ gas set at a flow rate of 250 mL/min (sccm) were supplied into the process container. Further, the interior of the process container was set at a pressure of 46,550 Pa and a temperature of 700° C. By doing, an amorphous carbon film was formed on an SiO$_2$ film disposed on each semiconductor wafer.

Thereafter, while the process container was maintained to have a vacuum state therein, the gases used for the amorphous carbon film formation were purged from inside the process container and lines, and then an SiO$_2$ film was formed. At this time, TEOS used as an Si-containing gas and O$_2$ gas used as an oxygen-containing gas were repeatedly supplied 100 to 200 times with a purge step interposed therebetween.

At this time, the film formation conditions were set as follows.

Film formation gas:
TEOS: 250 mL/min (sccm), and
O$_2$: 10 mL/min (sccm),
Pressure inside process container 1: 200 Pa, and
Temperature: 600° C.

As a result, the amorphous carbon film rendered an average film formation rate of 3.77 nm/min, a film thickness planar uniformity of ±7.51%, and a film thickness inter-substrate uniformity of ±1.77%. The SiO$_2$ film rendered an average film formation rate of 0.8 nm/min, a film thickness planar uniformity of ±2% or less, and a film thickness inter-substrate uniformity of ±2% or less.

According to the embodiment of the present invention, a batch type film formation apparatus is used for performing a film formation process on a plurality of target objects together at a time in a process container. In this film formation apparatus, while the process container is maintained to have a vacuum state therein, a carbon film is formed by CVD on each target object and then an Si-containing inorganic film is formed by CVD on the carbon film on each target object in the process container. Consequently, a multi-layered structure comprising the carbon film and Si-containing inorganic film can be formed with high efficiency, high productivity, and low cost. Further, the Si-containing inorganic film formation is performed sequentially after the carbon film formation while a vacuum state inside the, process container is maintained from the carbon film formation, i.e., without breaking a vacuum inside the process container. Consequently, the carbon film is prevented from being deteriorated in film quality.

The present invention is not limited to the embodiment described above, and it may be modified in various manners. For example, in the embodiment described above, the present invention is applied to a case where an amorphous carbon film at the bottom of a multi-layered resist structure and an Si-containing inorganic film laminated thereon are formed. However, the present invention is not limited to such a specific application. In the embodiment described above, an amorphous carbon film is formed, but the carbon film is not limited to an amorphous film. In the embodiment described above, the target object is a semiconductor wafer. However, the present invention may be applied to another substrate, such as a glass substrate used for a flat panel display (FPD), such as a liquid crystal display (LCD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for forming a multi-layered resist structure to be used as an etching mask for manufacturing semiconductor devices, the method comprising:
   placing a plurality of target objects at intervals in a vertical direction in an inner space inside a process container of a film formation apparatus, each of the target objects including an etching target film thereon;
   then, setting the inner space of the process container at a first vacuum pressure and a first heating temperature, and supplying ethylene gas into the inner space, thereby forming a carbon film by first CVD on the etching target film; and
   then, setting the inner space of the process container at a second vacuum pressure and a second heating temperature, and supplying an organic silicon source gas and a reactive gas selected from the group consisting of an oxidizing gas and a nitriding gas into the inner space, thereby forming an Si-containing inorganic film by second CVD on the carbon film, the Si-containing inorganic film being selected from the group consisting of an $SiO_2$ film, an SiN film, and a multi-layer film thereof,
   wherein the first CVD for forming the carbon film is performed as thermal CVD with the first heating temperature falling within a range of 600 to 800° C. while the ethylene gas is supplied into the inner space without being excited by plasma,
   the second vacuum pressure and the second heating temperature are lower than the first vacuum pressure and the first heating temperature, respectively,
   the first vacuum pressure is shifted to the second vacuum pressure while the inner space is maintained in a vacuum state,
   the second CVD for forming the Si-containing inorganic film is performed as MLD (Molecule Layered Deposition) CVD using a plasma assist, and is arranged to repeat a prescribed cycle a plurality of times, the prescribed cycle comprising
   a first sub step of supplying the organic silicon source gas into the inner space without supplying the reactive gas into the inner space,
   then, a second sub step of supplying a purge gas into the inner space and vacuum-exhausting the inner space without supplying the organic silicon source gas and the reactive gas into the inner space,
   then, a third sub step of supplying the reactive gas into the inner space without supplying the organic silicon source gas into the inner space, the third sub step being arranged to supply the reactive gas into the inner space while exciting the reactive gas by plasma in a plasma generation area adjacent to the inner space, and
   then, a fourth sub step of supplying a purge gas into the inner space and vacuum-exhausting the inner space without supplying the organic silicon source gas and the reactive gas into the inner space.

2. A computer readable medium containing program instructions for execution on a processor, wherein the program instructions, when executed by the processor, cause a film formation apparatus for a semiconductor process to conduct a film formation method for forming a multi-layer resist structure to be used as an etching mask for manufacturing semiconductor devices, the method comprising:
   placing a plurality of target objects at intervals in a vertical direction in an inner space inside a process container of the film formation apparatus, each of the target objects including an etching target film thereon:
   then, setting the inner space of the process container at a first vacuum pressure and a first heating temperature, and supplying ethylene gas into the inner space, thereby forming a carbon film by first CVD on the etching film; and
   then, setting the inner space of the process container at a second vacuum pressure and a second heating temperature, and supplying an organic silicon source gas and a reactive gas selected from the group consisting of an oxidizing gas and a nitriding gas into the inner space, thereby forming an Si-containing inorganic film by second CVD on the carbon film, the Si-containing inorganic film being selected from the group consisting of an $SiO_2$ film, an SiN film, an SiN film, and a multi-layered film thereof,
   wherein the first CVD for forming the carbon film is performed as thermal CVD with the first heating temperature falling within a range of 600 to 800° C. while the ethylene gas is supplied into the inner space without being excited by plasma,
   the second vacuum pressure and the second heating temperature are lower than the first vacuum pressure and the first heating temperature, respectively,
   the first vacuum pressure is shifted to the second vacuum pressure while the inner space is maintained in a vacuum state,
   the second CVD for forming the Si-containing inorganic film is performed as MLD (Molecule Layered Deposition) CVD using a plasma assist, and is arranged to repeat a prescribed cycle a plurality of times, the prescribed cycle comprising a first sub step of supplying the organic silicon source gas into the inner space without supplying the reactive gas into the inner space, then, a second sub step of supplying a purge gas into the inner space and vacuum-exhausting the inner space without supplying the organic silicon source gas and the reactive gas into the inner space, then, a third sub step of supplying the reactive gas into the inner space without supplying the organic silicon source gas into the inner space, the third sub step being arranged to supply the reactive gas into the inner space while exciting the reactive gas by plasma in a plasma generation area adjacent to the inner space, and then, a fourth sub step of supplying a purge gas into the inner space and vacuum-exhausting the inner space without supplying the organic silicon source gas and the reactive gas into the inner space.

3. The film formation method according to claim 1, wherein the carbon film comprises an amorphous carbon film.

4. The film formation method according to claim 1, wherein the oxidizing gas is $O_2$ and the nitriding gas is $NH_3$.

5. The film formation method according to claim 4, wherein the first heating temperature falls within a range of 600 to 700° C., and the second heating temperature falls within a range of 300° C. or less.

6. The film formation method according to claim 4, wherein the first vacuum pressure falls within a range of 6,667 to 66,665 Pa, and the second vacuum pressure falls within a range of 1.33 to 3,990 Pa.

* * * * *